(12) United States Patent
Imada et al.

(10) Patent No.: US 7,651,736 B2
(45) Date of Patent: Jan. 26, 2010

(54) METHOD OF PRODUCING A NANOHOLE ON A STRUCTURE BY REMOVAL OF PROJECTIONS AND ANODIC OXIDATION

(75) Inventors: Aya Imada, Tokyo (JP); Toru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 319 days.

(21) Appl. No.: 11/766,908

(22) Filed: Jun. 22, 2007

(65) Prior Publication Data

US 2008/0050526 A1  Feb. 28, 2008

(30) Foreign Application Priority Data

Aug. 24, 2006 (JP) .............................. 2006-228364
May 23, 2007 (JP) .............................. 2007/137225

(51) Int. Cl.
*B05D 3/00* (2006.01)
(52) U.S. Cl. ...................... 427/271; 427/272; 427/287; 205/106; 205/121; 205/124; 205/199
(58) Field of Classification Search ................. 427/271, 427/272, 287; 205/106, 121, 124, 199
See application file for complete search history.

(56) References Cited

U.S. PATENT DOCUMENTS

| 6,610,463 | B1 * | 8/2003 | Ohkura et al. | ............... 430/322 |
|---|---|---|---|---|
| 6,943,488 | B2 * | 9/2005 | Yasui et al. | .................. 313/301 |
| 7,288,203 | B2 | 10/2007 | Imada et al. | .................. 216/22 |
| 2003/0186514 | A1 * | 10/2003 | Imada et al. | ................. 438/466 |
| 2004/0033339 | A1 * | 2/2004 | Fukutani et al. | ............. 428/137 |
| 2005/0211663 | A1 * | 9/2005 | Imada et al. | .................. 216/22 |

FOREIGN PATENT DOCUMENTS

JP  6-032675  2/1994

OTHER PUBLICATIONS

Asoh et al., "Fabrication of Ideally Ordered Anodic Porous Alumina with 63nm Hole Periodicity Using Sulfuric Acid", J. Vac. Sci. Technol. B 19(2), 569-572, Mar./Apr. 2001.
Shingubara et al., "Ordered Two-Dimensional Nanowire Array Formation Using Self-Organized Nanoholes of Anodically Oxidized Aluminum", Jpn. J. Appl. Phys., 36, 7791-7795, Dec. 1997.

* cited by examiner

*Primary Examiner*—Binh X Tran
(74) *Attorney, Agent, or Firm*—Fitzpatrick, Cella, Harper & Scinto

(57) ABSTRACT

The present invention provides a method of producing a structure, which is capable of easily obtaining a structure of the nanometer scale by using an anodic oxidation method. A method of producing a structure with a hole includes: forming first projected structures regularly arranged on a substrate; forming a first anodic oxidating layer on the substrate having the first projected structures, thereby forming first recessed structures at center portions of cells formed by the projected structures on the anodic oxidating layer; removing the first projected structures to form holes; and subjecting the first anodic oxidating layer to anodic oxidation to form holes at positions of the first recessed structures.

7 Claims, 7 Drawing Sheets

METHOD OF PRODUCING A NANOHOLE ON A STRUCTURE BY REMOVAL OF PROJECTIONS AND ANODIC OXIDATION

BACKGROUND OF THE INVENTION

1. Field of the Invention

The present invention relates to a method of producing a structure having projected and recessed structures having an interval of the nanometer scale.

2. Description of the Related Art

As a technique of producing a fine structure on the surface of an object, methods such as photolithography, electron beam exposure, X-ray exposure, and nanoimprint lithography have been known conventionally.

In addition to the above-mentioned methods, there is a method of forming a structure by a bottom-up method using an aluminum anodic oxidation method or a molecular self-organized structure.

Furthermore, a method of producing a pillar-type replica structure using a hole-type nanostructure formed by an anodic oxidation method as a mold has also been proposed. Japanese Patent Application Laid-Open No. 6-32675, Jpn. J. Appl. 36, 7791, 1997, and J. VAc. Sci. Technol. B. 19(2), 569, 2 propose methods in which a hole-type nanostructure is used as a mold, the hole is filled with a material such as resin or metal, and the mold is removed to obtain a pillar structure. Thus, a structure having a minute size and a high aspect ratio, which cannot be obtained by a production method using a semiconductor process, can be produced.

According to the direct patterning technique such as the above-mentioned electron beam lithography and ion beam lithography, a longer period of time is required for forming a pattern as a structure becomes finer. Therefore, for a product mass-produced at low cost, as a mainstream, a mask for X-ray or UV-ray exposure or for an imprint mold is produced precisely by a direct patterning technique, and patterning is performed in a short period of time at a time by photolithography or nanoimprint lithography.

However, there is a limit to the size of a structure that can be formed by any of the above-mentioned methods.

At present, even in an electron beam exposure capable of producing a finest structure, although a single dot of φ10 nm can be formed, it is difficult to arrange the dots with a pitch of 20 nm or less in a large area.

Furthermore, although the above-mentioned conventional method of forming a structure by the bottom-up method using a self-organization method by anodic oxidation of aluminum or a molecular self-organized structure is suitable for forming a regularly repetitive structure in a large area, it is difficult to form an arbitrary structure.

SUMMARY OF THE INVENTION

In view of the above-mentioned problem, an object of the present invention is to provide a method of producing a structure, which is capable of easily obtaining a structure of the nanometer scale, using an anodic oxidation method.

According to a first aspect of the present invention, there is provided a method of producing a structure to solve the above-mentioned problems, including: forming projected structures regularly arranged on a substrate; forming an anodic oxidating layer on the substrate having the projected structures, thereby forming recessed structures at center portions of cells formed by the projected structures on the anodic oxidating layer; removing the projected structures to form holes; and subjecting the anodic oxidating layer to anodic oxidation to form holes at positions of the recessed structures.

According to another aspect of the present invention, there is provided a method of producing a structure to solve the above-mentioned problems, including: forming projected structures regularly arranged on a substrate; forming an anodic oxidating layer on the substrate having the projected structures, thereby forming recessed structures at center portions of cells formed by the projected structures on the anodic oxidating layer; subjecting the anodic oxidating layer to anodic oxidation to form holes at positions of the recessed structures; and removing the projected structures to form holes.

According to still another aspect of the present invention, there is provided a method of producing a structure to solve the above-mentioned problems, including: filling the holes of the structure produced by the method described above with a filling material; and separating the filling material from the structure, thereby obtaining a reversed structure of which the recessed and projected portions respectively correspond to the projected and recessed portions of the structure produced by the method described above.

According to the present invention, there can be obtained a method of producing a structure capable of easily obtaining a structure of the nanometer scale by using an anodic oxidation method.

Further features of the present invention will become apparent from the following description of exemplary embodiments with reference to the attached drawings.

DESCRIPTION OF THE EMBODIMENTS

A first method of producing a structure solving the above-mentioned problem includes the following: forming projected structures regularly arranged on a substrate; and forming an anodic oxidating layer on the substrate having the projected structures, thereby forming recessed structures at center portions of cells formed by the projected structures on the anodic oxidating layer. Furthermore, the method includes: removing the projected structures to form holes; and subjecting the anodic oxidating layer to anodic oxidation to form holes at positions of the recessed structures.

In this case, the order of the step of removing the projected structures to form holes and the step of subjecting the anodic oxidating layer to anodic oxidation to form holes at positions of recessed structures may be arbitrary.

Figure 1A:
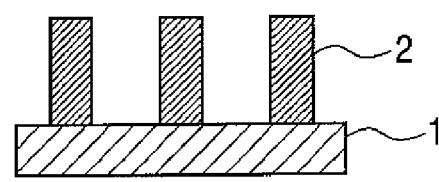
FIGS. 1A, 1B, 1C, 1D and 1E are cross-sectional views illustrating the steps in one embodiment of a method of producing a structure of the present invention.
Figure 1B:
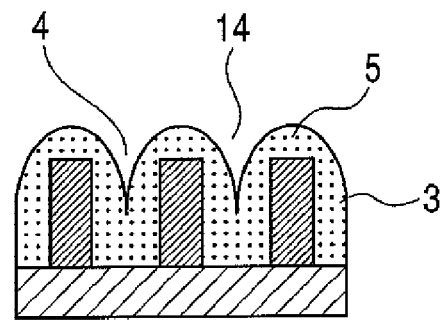
Figure 1C:
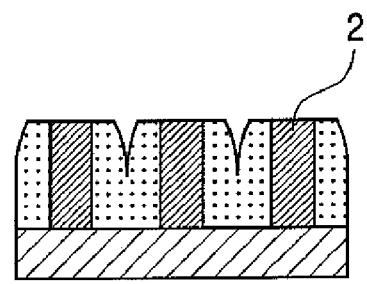
Figure 1D:
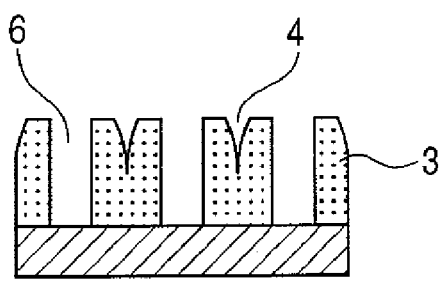
Figure 1E:
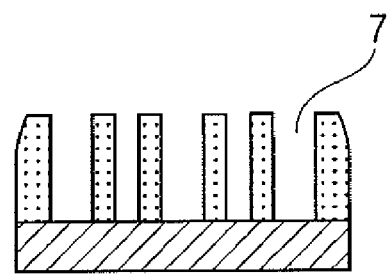
Figure 2A:
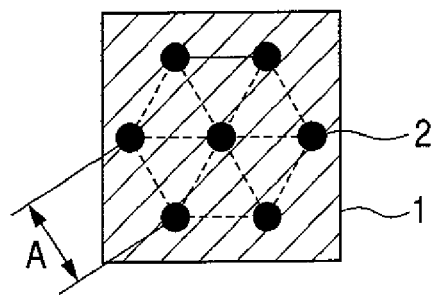
FIGS. 2A, 2B, 2C, 2D and 2E are plan views illustrating the steps in one embodiment of the method of producing a structure of the present invention.
Figure 2B:
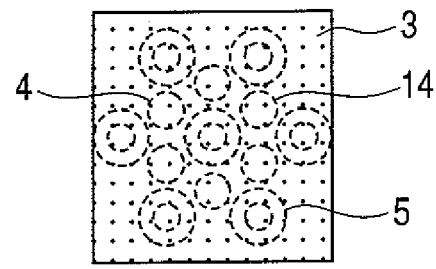
Figure 2C:
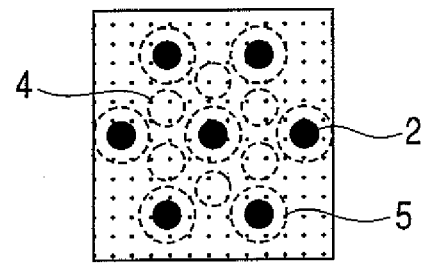

The first method of the present invention will be described with reference to FIGS. 1A to 1E and FIGS. 2A to 2E. FIGS. 1A to 1E are cross-sectional views illustrating the steps in one embodiment of a method of producing a structure of the present invention. FIGS. 2A to 2E are plan views illustrating the steps in one embodiment of the method of producing a structure of the present invention As shown in FIGS. 1A and 2A, first projected structures 2 in a triangular lattice arrangement with a period A are formed on a substrate 1 using photolithography, electron beam lithography, or etching. The first projected structures 2 are formed of resin, metal, or the like. Next, a first anodic oxidating layer 3 is laminated on the first projected structures 1 using sputtering, vapor deposition, or the like, and first recessed structures 4 and second projected structures 5 are formed on the surface of the first anodic oxidating layer using sputtering, vapor deposition, or the like (FIG. 1B). The anodic oxidating layer 3 may be made of, for example, aluminum or an aluminum alloy. The first recessed structures 4 are positioned at centers of cells 14 formed between the arranged first projected structures 2, i.e., at centers of the second projected structures 5 (FIG. 2B). At this time, it is desirable to use the forming condition that the first recessed structures 4 become deeper with respect to the second projected structures 5. Next, vertex portions of the first projected structures 2 buried in the first anodic oxidating layer 3 are exposed (FIG. 1C and FIG. 2C). Next, the first projected structures are removed by wet etching or dry etching, whereby the second recessed structures 6 are formed (FIG. ED and FIG. 2D). At this time, the first recessed structures 4 need to remain.

Figure 2D:
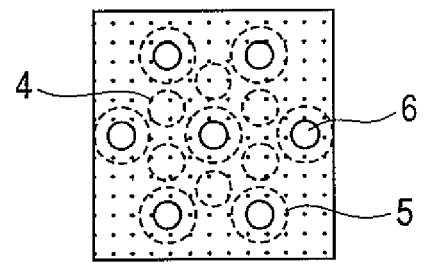
Figure 2E:
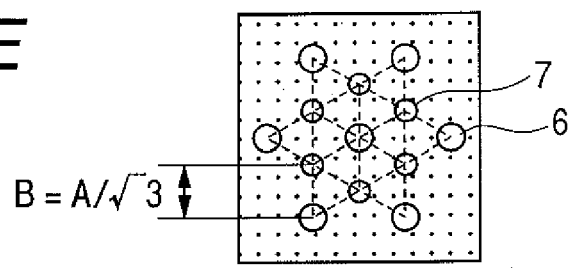

Assuming that the period of the arrangement of the first recessed structures 4 and the second recessed structures 6 is B, when the first projected structures 2 are in a triangular lattice arrangement, $B[nm]=A[nm]/3^{1/2}$, and when the first projected structures 2 are in a tetragonal lattice arrangement, $B[nm]=A[nm]/2^{1/2}$. Next, using the first recessed structures 4 as starting points of forming nanoholes (a hole structure of the nanometer scale will be referred to as "nanohole" in the present invention), the first anodic oxidating layer 3 is subjected to anodic oxidation. For example, when the first projected structures 2 are in a triangular lattice arrangement, the substrate is immersed in an acidic solution as an anode and is supplied with an anodic oxidation voltage $[V]=A[nm]/3^{1/2} \times 2.5^{-1}$, and the anodic oxidating layer 3 is subjected to oxidation and etching reaction, whereby a nanohole structure is formed (FIG. 1E and FIG. 2E). Because the second recessed structures 6 have already been recessed structures, nanoholes are not formed, and nanoholes are formed from the first recessed structures 4.

In the case where the conductive substrate 1 is exposed in the bottom portions of the second recessed structures 6, an anodic oxidating current is concentrated, so it is necessary to form a base layer to be an oxidation insulating film on the substrate 1 by anodic oxidation.

After the step of exposing the vertex portions of the first projected structures 2 (FIG. 1C), the first anodic oxidating layer 3 may be subjected to anodic oxidation using the first recessed structures 4 as starting points of forming nanoholes. In this case, the first projected structures 2 are removed by wet etching or dry etching after the anodic oxidation, whereby a structure as shown in FIG. 1E can be produced.

Next, another embodiment of the first method of the present invention will be described with reference to FIGS. 6A to 6E.

This method is similar to the above-mentioned method up to the step in FIG. 1B, so the subsequent steps will be described.

Figure 6A:
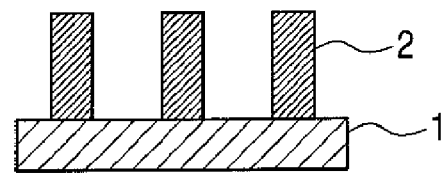
FIGS. 6A, 6B, 6C, 6D and 6E are cross-sectional views illustrating the steps in one embodiment of the method of producing a structure of the present invention.
Figure 6B:
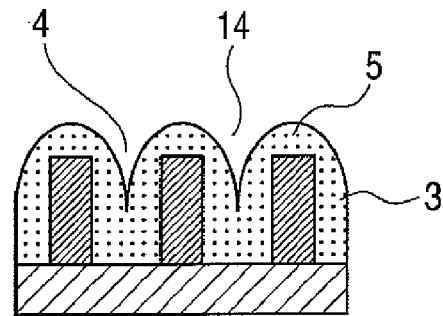
Figure 6C:
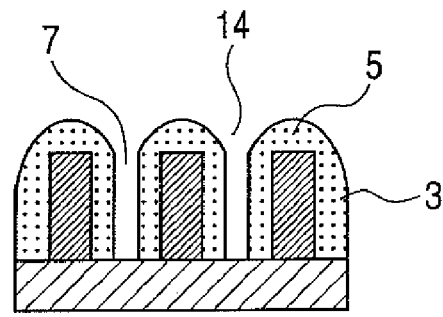

After FIG. 6B, the first anodic oxidating layer 3 is subjected to anodic oxidation using the first recessed structures 4 as starting points of forming nanoholes (FIG. 6C). The anodic oxidation method is the same as that described above.

Figure 6D:
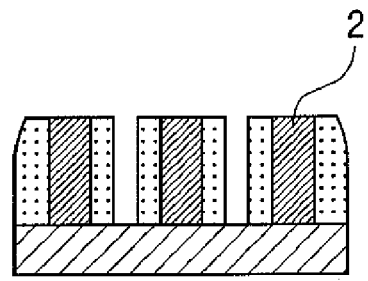
Figure 6E:
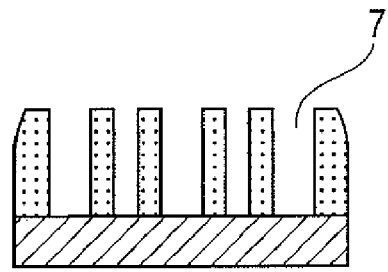

Next, vertex portions of the first projected structures 2 buried in the first anodic oxidating layer 3 are exposed (FIG. 6D).

Next, the first projected structures 2 are removed by wet etching or dry etching, whereby the second recessed structures 6 are formed (FIG. 1E).

According to the above-mentioned method, a structure having a nanohole of the present invention can also be produced.

A second method of the present invention will be described. The second method of the present invention will be described with reference to FIGS. 3A to 3F. FIGS. 3A to 3F are cross-sectional views illustrating the steps in another embodiment of the method of producing a structure of the present invention.

The second method of producing a structure includes the following: forming a base metal layer on a substrate, and forming a second anodic oxidating layer on the base metal layer. Furthermore, the method includes: subjecting the second anodic oxidating layer to anodic oxidation to form regularly arranged holes and oxidating the base metal layer by the anodic oxidation, thereby allowing a metal oxide to project from the holes to form projected structures arranged regularly; removing a remaining portion of the second anodic oxidating layer; forming a first anodic oxidating layer on the regularly arranged projected structures, thereby forming recessed structures of the first anodic oxidating layer at centers of cells formed between the arranged projected structures; removing the projected structures to form holes; and subjecting the first anodic oxidating layer to anodic oxidation to form holes at positions of the recessed structures.

Figure 3A:
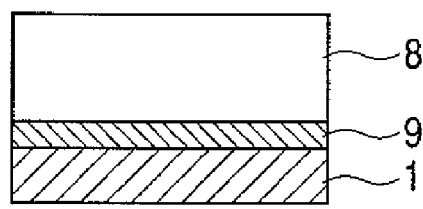
FIGS. 3A, 3B, 3C, 3D, 3E and 3F are cross-sectional views illustrating steps in another embodiment of the method of producing a structure of the present invention.

For example, a base metal layer 9 is formed on the substrate 1, and a second anodic oxidating layer 8 is formed thereon (FIG. 3A). Herein, the base metal layer 9 may be made of a material that forms an oxide by anodic oxidation of the second anodic oxidating layer 8 and that contains, as a main component, at least one element selected from W, Nb, Mo, Ta, Ti, Zr, and Hf. The main component refers to that having a largest weight fraction among the elements contained in a certain material.

Figure 3B:
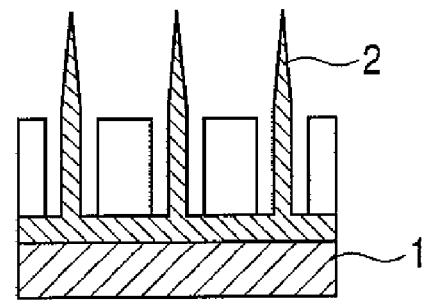
Figure 3C:
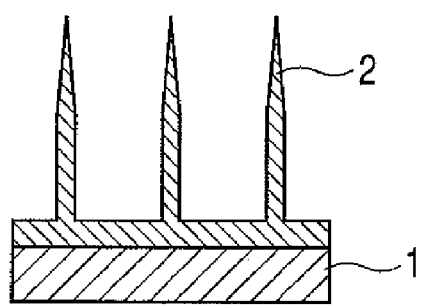

Next, the substrate is immersed in an acidic solution as an anode, whereby a nanohole structure is formed in the second anodic oxidating layer 8. The anodic oxidation voltage supplied at this time may be $[V]=A[nm] \times 2.5^{-1}$, assuming that the period of regularly arranged nanoholes to be formed is A. As a method of regulating nanoholes, a self regulating condition of alumina nanoholes, the use of starting points of nanoholes on the surface of the second anodic oxidating layer 8, and the like are proposed. Anodic oxidation is continued even after the bottom portions of nanoholes to be formed reach the base metal layer 9, or a voltage is supplied again after the solution is changed to another kind of solution in which the oxidation is promoted more than the dissolution of the base metal layer 9. As a result, the volume of the base metal layer 9 increases, and the base metal layer 9 is formed as the first projected structure 2 in the nanoholes formed in the second anodic oxidating layer 8 (FIG. 3B). Next, etching is performed in an atmosphere of gas or liquid in which the second anodic oxidating layer 8 is dissolved and the first projected structures 2 are not affected, whereby the second anodic oxidating layer 8 is removed (FIG. 3C).

Figure 3D:
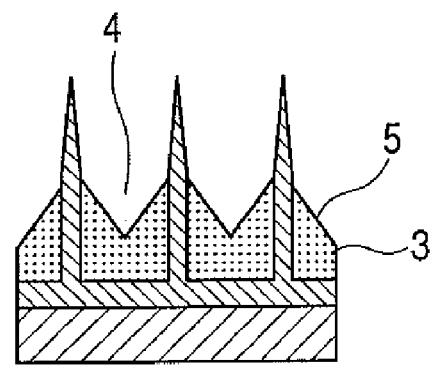
Figure 3E:
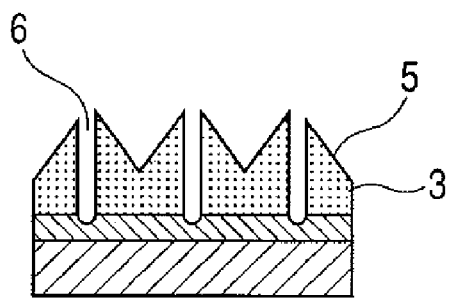
Figure 3F:
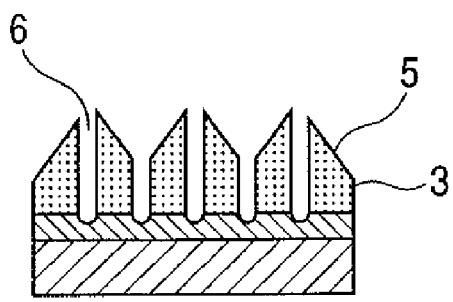

Next, in the same way as in the first method of the present invention, using sputtering, vapor deposition, or the like, the first anodic oxidating layer 3 is laminated on the first projected structures 2, and the first recessed structures 4 are formed on the surface of the first anodic oxidating layer (FIG. 3D). Herein, in the case where the first projected structures made of the base metal layer have a high aspect or the period A is large relative to the diameter of the first projected structures, the first projected structures 2 are likely to be exposed from the vertex portions of the second projected structures 5. Therefore, the step of exposing the first projected structures 2 as in the first method of the present invention is not required, and etching is performed in an atmosphere of gas or liquid in which the first projected structures 2 are removed without affecting the first anodic oxidating layer 3, whereby second recessed structures 6 can be formed (FIG. 3E). Finally, when anodic oxidation is performed at an anodic oxidation voltage B $[nm] \times 2.5^{-1}$ [v] in the same way as in the first method, recessed structures with a period B are produced (FIG. 3F).

The steps after FIG. 3D can also be performed as follows.

Another embodiment of the second method of the present invention will be described with reference to FIGS. 7A to 7F.

This method is similar to the above-mentioned method up to the step in FIG. 3D, so the subsequent steps will be described.

Figure 7A:
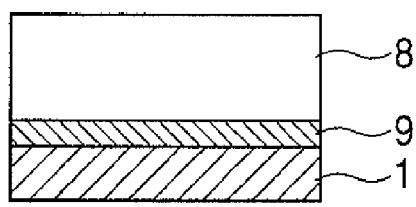
FIGS. 7A, 7B, 7C, 7D, 7E and 7F are cross-sectional views illustrating the steps in one embodiment of the method of producing a structure of the present invention.
Figure 7B:
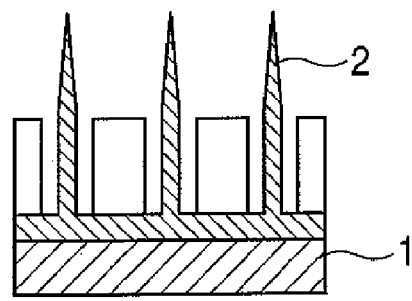
Figure 7C:
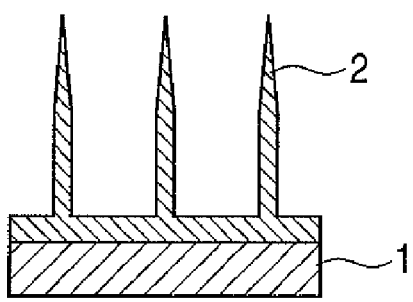
Figure 7D:
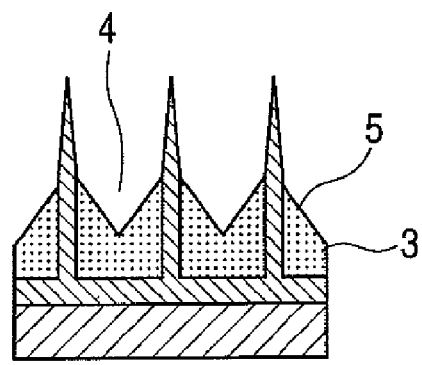
Figure 7E:
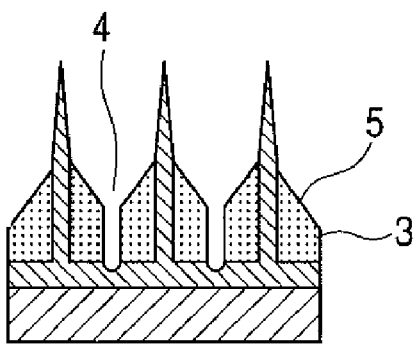

After FIG. 7D, using the first recessed structures 4 as starting points of forming nanoholes, the first anodic oxidating layer 3 is subjected to anodic oxidation (FIG. 7E). The method of anodic oxidation is the same as that as described above.

Figure 7F:
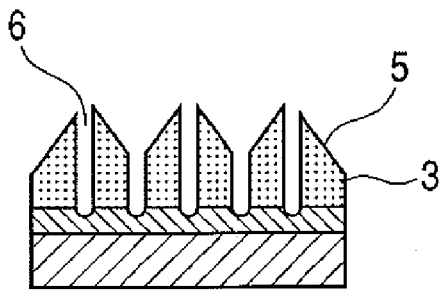

Finally, by removing the first projected structures, a structure having a nanohole according to the present invention can be produced (FIG. 7F).

As described above, after forming the first recessed structures and the second projected structures in the first and second methods of the present invention as described above, anodic oxidation may be performed at an anodic oxidation voltage $[V]=B[nm] \times 2.5^{-1}$, and thereafter, the first projected structures may be removed. In this case, it is not preferable that the first projected structures are made of an insulator, because nanoholes are formed from the periphery of the first projected structures. It is not preferable that the first projected structures are made of a conductor and are in conduction with metal, because current is concentrated during anodic oxidation. That is, it is preferable that the first projected structures are made of a material having an appropriate resistance, a metal which forms an oxide with an anodic oxidation voltage, or the like.

Figure 4:
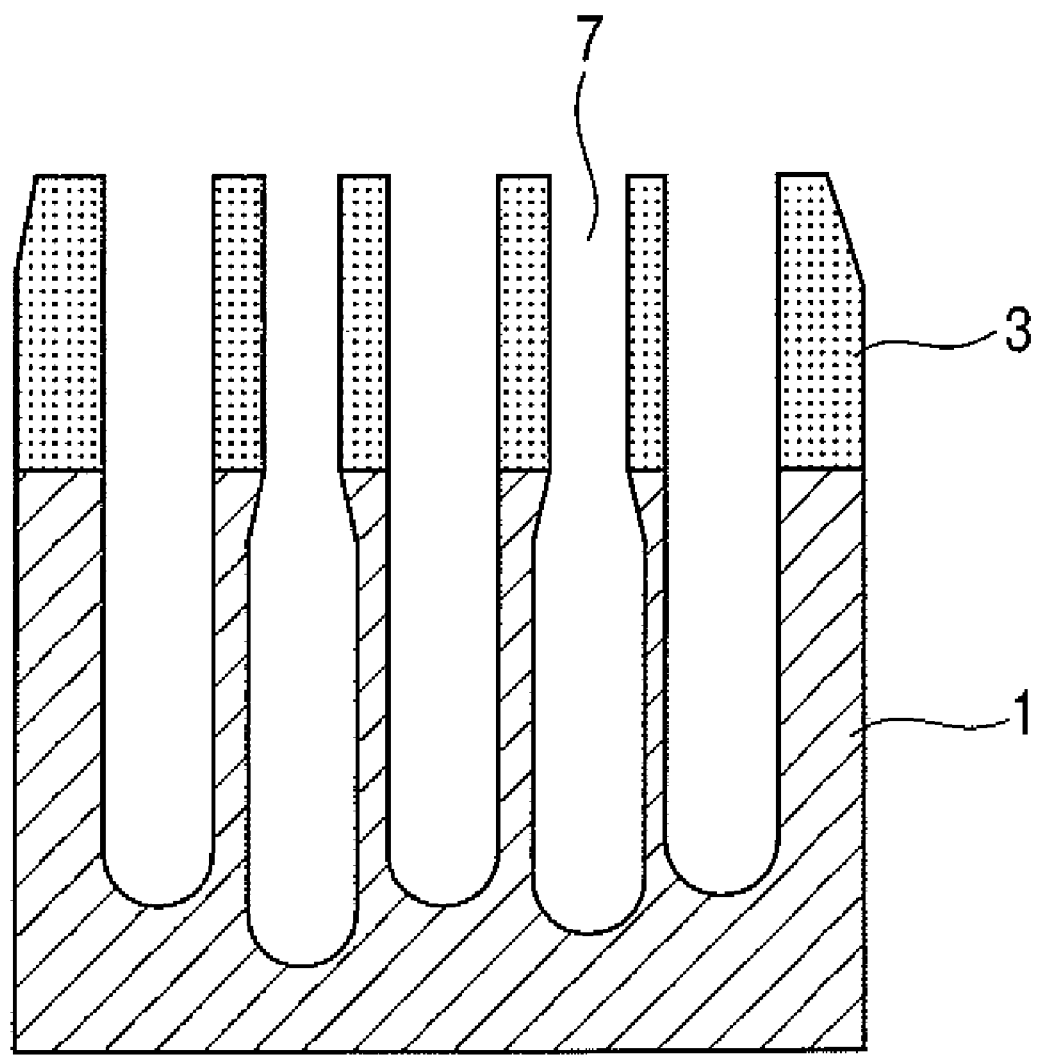
FIG. 4 is a cross-sectional view illustrating another embodiment of the method of producing a structure of the present invention.

Next, a third production method of the present invention will be described. In the first method of the present invention, when the substrate 1 is made of aluminum or an aluminum alloy, which is a material for forming nanoholes by anodic oxidation, a structure having a higher aspect ratio can be formed. In anodic oxidation in the first method of the present invention, both the second recessed structures and the first recessed structures function as starting points, and nanoholes can be formed continuously in the substrate 1 (FIG. 4). Herein, when the composition of the first anodic oxidating layer 3 is different from that of the substrate 1, even if anodic oxidation is performed under the same anodic oxidation condition, the diameter of nanoholes to be formed may vary.

The structure produced by the above-mentioned method of the present invention is filled with a different material, and then the filling material is separated, whereby a replica structure (reversed structure in which the projected and recessed portions of the structure produced by the above-mentioned method of the present invention are reversed) can also be produced. As to filling, various kinds of methods are considered. For example, in the case of filling a liquid resin, the resin is dropped onto hole openings in vacuum, or degassing processing is performed by centrifugal force. Furthermore, in the case of filling a metal or the like, sputtering or vapor deposition is performed.

Figure 5:
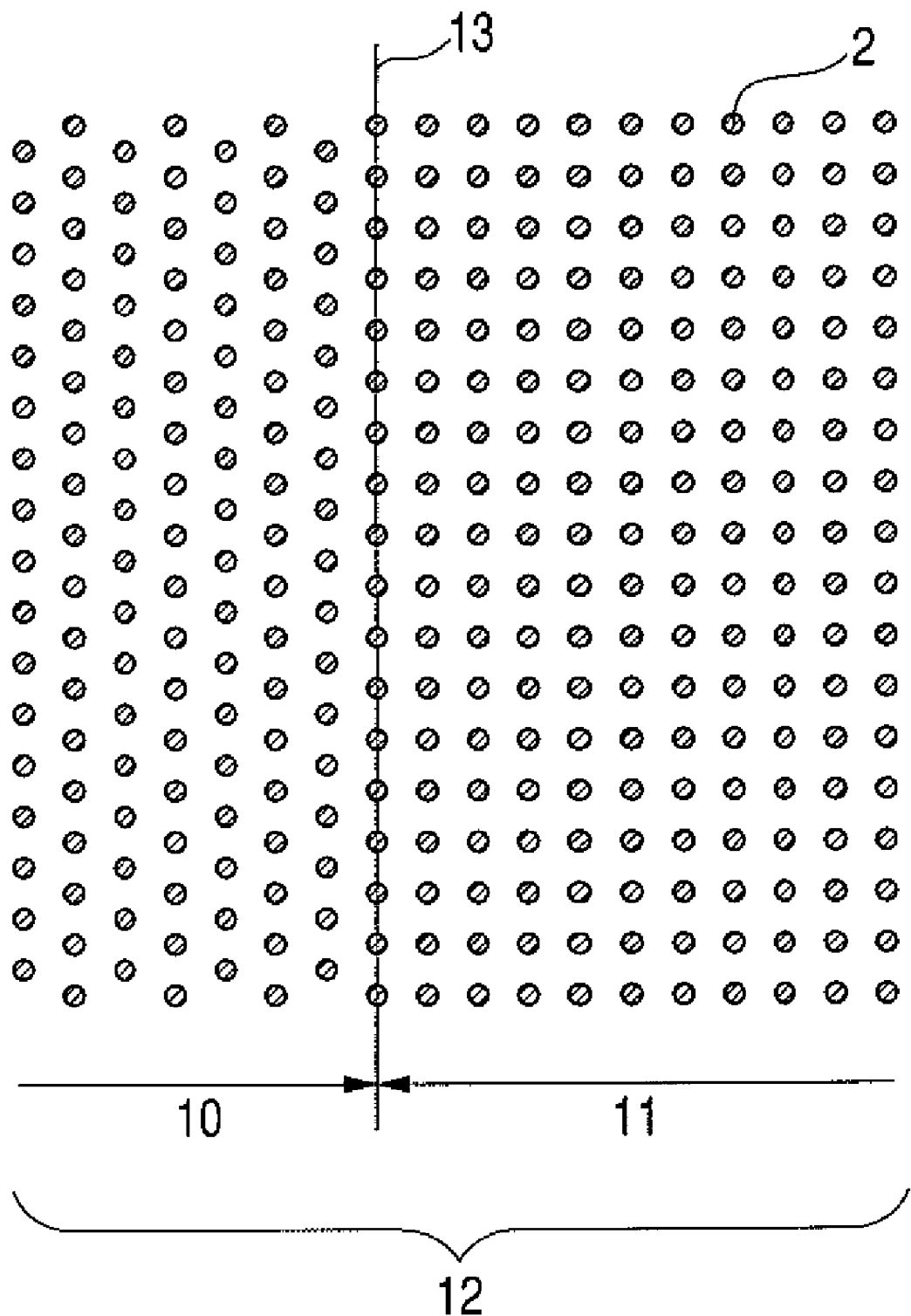
FIG. 5 is an explanatory view illustrating another embodiment of the method of producing a structure of the present invention.

In the first to third methods of the present invention, even in the case where the regular arrangement of the first projected structures is composed of a plurality of kinds of arrangements, the structure can be produced by a similar method. For example, there is a case where a triangular lattice arrangement with a period A and a tetragonal lattice region with the period A are arranged with a common part 13 (FIG. 5). At this time, it is preferable that the anodic oxidation voltage is $A[nm] \times 2.5^{-1}$ [V], and the structure can be formed in accordance with the arrangement without causing disorder of the holes in the common part.

EXAMPLES

Hereinafter, the present invention will be described by way of examples with reference to the drawings.

Example 1

First, a substrate 1 is obtained by laminating titanium (Ti) with a thickness of 10 nm on silicon (Si). On the substrate 1, first projected structures 2, in which projected structures (diameter: 35 nm and height: 50 nm) are arranged in a triangular lattice arrangement with a period of 70 nm as shown in FIGS. 1A and 2A, is formed on the substrate with an electron beam resist by electron beam lithography. As the resist, ZEP520A produced by ZEON Co. or polymethyl methacrylate (PMMA) was used. Next, a first anodic oxidating layer 3 made of an aluminum-hafnium (AlHf, the atomic weight percentage of Hf: 6 atm %) alloy with a thickness of 40 nm is laminated on the electron beam resist. On the surface of the first anodic oxidating layer 3, first recessed structures 4 and second projected structures 5 are formed (FIG. 1B). By adjusting sputtering conditions, the first recessed structures 4 are positioned at centers of gravity (center points) of unit cells of the second recessed structures 5, and the bottom portions of the first recessed structures are positioned lower than the first projected structures (FIG. 2B). Next, the vertex portion of the electron resist buried in the AlHf alloy layer is exposed by dry etching in a mixed plasma of chlorine gas and oxygen gas (FIG. 1C and FIG. 2C). Subsequently, the electron beam resist is removed by dry etching in an oxygen gas plasma (FIG. 1D and FIG. 2D). At this time, care should be taken so that the first recessed structures 4 remain without fail. The period of the arrangement of the first recessed structures 4 and the second recessed structures 6 is about 40 nm. The substrate is immersed in a sulfuric acid aqueous solution (1 mol/L, 10° C.) as an anode, and anodic oxidation is performed at a voltage of 16.2 V. Oxidation and etching reaction are effected with both the first recessed structures 4 and the second recessed structures 6 being as starting points, whereby a nanohole structure is formed (FIG. 1E and FIG. 2E).

Because the second recessed structures have already been of recessed structures, a sulfuric acid aqueous solution enters therein. However, the titanium layer becomes an oxide by anodic oxidation and is difficult to be dissolved, so nanoholes are formed only in the first recessed structures.

Furthermore, tungsten (W) is deposited by sputtering so as to fill the nanohole structure, and a support substrate is attached thereto with an adhesive and is peeled off, whereby a replica projected structure with the projected and recessed portions as reversed can be obtained.

Example 2

On a silicon substrate 1, tungsten (W) is laminated to a thickness of 20 nm as a base metal layer 9, and furthermore, the same aluminum-hafnium alloy as that of Example 1 is formed to a thickness of 200 nm as a second anodic oxidating layer 8 (FIG. 3A). On the surface of the aluminum-hafnium alloy layer, recessed structures in a triangular lattice arrangement with a pitch of 70 nm is formed by a focused ion beam (FIB) method. Next, a substrate is immersed in an oxalic acid aqueous solution (0.3 mol/L, 20° C.) as an anode, and a voltage of 28 V is applied to the aluminum-hafnium alloy layer, whereby anodic oxidating nanoholes are formed. The nanoholes are formed with the recessed structures formed by the FIB method being starting points, so a triangular lattice arrangement with a pitch of 70 nm is obtained. If the anodic oxidation is continued even after the bottom portions of the nanoholes reach the tungsten layer, the oxidation is promoted to increase the volume of tungsten, whereby tungsten grows in the nanoholes (FIG. 3B). At the time when the length of the tungsten oxide from the substrate reaches 200 nm, the anodic oxidation is terminated. Herein, in the case of increasing the diameter of the tungsten oxide, the following may be conducted. The anodic oxidation is suspended once at the time when the nanoholes reach the tungsten layer, the nanoholes are immersed in a phosphoric acid aqueous solution (5 wt %) to be dissolved to an arbitrary diameter, and anodic oxidation is performed again to grow tungsten oxide.

When the substrate is immersed in a phosphoric acid aqueous solution (5 wt %) for several hours to remove the aluminum-hafnium alloy layer, the tungsten oxide arranged regularly remains (FIG. 3C). In the same way as in Example 1, the aluminum-hafnium alloy layer with a thickness of 150 nm is laminated by sputtering, whereby first recessed structures 4 and second projected structures 5 are formed (FIG. 3D). The tungsten oxide can form a structure with a very high aspect ratio, compared with the resist structure defined by lithography in Example 1, so even after the first anodic oxidating layer is laminated, the entire surface of tungsten oxide is not covered. Therefore, tungsten oxide can be removed without exposing the tip end portions of the second projected structures 5. Tungsten oxide is removed by baking and immersion in a phosphoric acid aqueous solution (5 wt %) (FIG. 3E). Finally, the resultant structures are immersed in a sulfuric acid aqueous solution (1 mol/L, 10° C.) in the same way as in the first method, and anodic oxidation is performed at an anodic oxidation voltage of 16.2 [V], so a triangular lattice arrangement nanohole structure with a period of 40 nm is obtained.

In this case, it is also applicable to perform anodic oxidation at a voltage of 16.2 [V] without removing tungsten oxide followed by removal of tungsten oxide. Under the same condition as that of the above, first recessed structures and second projected structures are formed (FIG. 3D), and anodic oxidation at a voltage of 16.2 [V] is performed without removing tungsten oxide, whereby third recessed structures are formed with the first recessed structures being starting points. In conducting normal anodic oxidation, which is a self-regulating phenomenon, nanoholes are formed even at the position of the tungsten oxide. However, in this case, due to the presence of tungsten oxide, holes are not formed, oxidation is promoted at a rate in accordance with an applied voltage, and the formation of nanoholes from the first recessed structures is not inhibited. Next, when the tungsten oxide 2 is baked and immersed in a sulfuric acid aqueous solution (5 wt %) and is removed, a structure shown in FIG. 3F is obtained.

Example 3

The case where the substrate 1 is made of aluminum in Example 1 will be described. After the first projected structures are removed, the resultant structures are immersed in a sulfuric acid aqueous solution (1 mol/L, 10° C.), and a voltage of 16.2 [V] is applied to perform anodic oxidation. The first recessed structures and the second recessed structures function as starting points of forming nanoholes, whereby a structure is formed. Nanoholes can be formed continuously from the aluminum-hafnium alloy layer to the aluminum substrate. Under the above-mentioned anodic acid oxidation conditions, the diameter of the nanoholes formed in the aluminum-hafnium alloy is smaller than that of the nanoholes formed in the aluminum substrate; however, the regularity is not lost (FIG. 4). Furthermore, the formation of nanoholes proceeds further as the depth of the initial starting point is larger. Therefore, in the case where the depth of the second recessed structures 6 is larger than that of the first recessed structures 4 (FIG. 1D), nanoholes from the second recessed structures are formed earlier (FIG. 4). Herein, it is not preferable that there is too much difference in depth between the first recessed structures and the second recessed structures, because the verticality of nanoholes from the deep side with respect to the substrate is impaired.

According to the present invention, a structure of the nanometer scale can be obtained easily using a conventional anodic oxidation method of aluminum or the like, so the present invention can be used for a method of producing a structure on a nanometer scale.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2006-228364, filed Aug. 24, 2006 and 2007-137225, filed May 23, 2007, which are hereby incorporated by reference herein in their entirety.

What is claimed is:

1. A method of producing a structure with a hole, comprising:
    forming projected structures regularly arranged on a substrate;
    forming an anodic oxidating layer on the substrate having the projected structures, thereby forming recessed structures at center portions of cells formed by the projected structures on the anodic oxidating layer;
    removing the projected structures to form first holes; and
    subjecting the anodic oxidating layer to anodic oxidation to form second holes different from the first holes at positions of the recessed structures.

2. A method of producing a structure comprising:
    filling the first and second holes of the structure produced by the method according to claim 1 with a filling material; and
    separating the filling material from the structure, thereby obtaining a reversed structure, wherein the projected portions correspond to the first and second holes.

3. A method of producing a structure according to claim 1, wherein the step of forming the projected structures comprises:
- forming a base metal layer on the substrate;
- forming an anodic oxidating layer on the base metal layer;
- subjecting the anodic oxidating layer to anodic oxidation to form regularly arranged holes and oxidating the base metal layer by the anodic oxidation, thereby allowing a metal oxide to project from the holes; and
- removing a remaining portion of the anodic oxidating layer.

4. A method of producing a structure according to claim 3, wherein the base metal layer comprises least one element selected from the group consisting of W, Nb, Mo, Ta, Ti, Zr, and Hf.

5. A method of producing a structure with a hole, comprising:
- forming projected structures regularly arranged on a substrate;
- forming an anodic oxidating layer on the substrate having the projected structures, thereby forming recessed structures at center portions of cells formed by the projected structures on the anodic oxidating layer;
- subjecting the anodic oxidating layer to anodic oxidation to form second holes at positions of the recessed structures; and
- removing the projected structures to form first holes different from the second holes.

6. A method of producing a structure according to claim 5, wherein the step of forming the projected structures comprises:
- forming a base metal layer on the substrate;
- forming an anodic oxidating layer on the base metal layer;
- subjecting the anodic oxidating layer to anodic oxidation to form regularly arranged holes and oxidating the base metal layer by the anodic oxidation, thereby allowing a metal oxide to project from the holes; and
- removing a remaining portion of the anodic oxidating layer.

7. A method of producing a structure according to claim 6, wherein the base metal layer comprises least one element selected from the group consisting of W, Nb, Mo, Ta, Ti, Zr, and Hf.

* * * * *